US012677662B2

(12) United States Patent
Pfefferlein et al.

(10) Patent No.: US 12,677,662 B2
(45) Date of Patent: Jul. 7, 2026

(54) SEMICONDUCTOR MODULE COMPRISING AT LEAST ONE SEMICONDUCTOR ELEMENT

(71) Applicant: Siemens Aktiengesellschaft, Munich (DE)

(72) Inventors: Stefan Pfefferlein, Heroldsberg (DE); Ronny Werner, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 403 days.

(21) Appl. No.: 18/266,033

(22) PCT Filed: Oct. 12, 2021

(86) PCT No.: PCT/EP2021/078087
§ 371 (c)(1),
(2) Date: Jun. 8, 2023

(87) PCT Pub. No.: WO2022/122222
PCT Pub. Date: Jun. 16, 2022

(65) Prior Publication Data
US 2024/0038630 A1 Feb. 1, 2024

(30) Foreign Application Priority Data
Dec. 9, 2020 (EP) ..................................... 20212842

(51) Int. Cl.
*H01L 23/427* (2006.01)
*H01L 23/498* (2006.01)
(Continued)

(52) U.S. Cl.
CPC ......... *H10W 40/73* (2026.01); *H10W 40/037* (2026.01); *H10W 70/685* (2026.01); *H10W 90/734* (2026.01); *H10W 90/736* (2026.01)

(58) Field of Classification Search
CPC .............. H01L 23/427; H01L 21/4882; H01L 23/49822; H01L 24/32
See application file for complete search history.

(56) References Cited

U.S. PATENT DOCUMENTS

2004/0056348 A1 3/2004 Nakanishi et al.
2005/0051300 A1* 3/2005 Searls ................... F28D 20/021
165/104.21
(Continued)

FOREIGN PATENT DOCUMENTS

DE 102012217698 A1 4/2014
DE 102014213545 A1 4/2015
(Continued)

OTHER PUBLICATIONS

PCT International Search Report and Written Opinion of International Searching Authority mailed Jan. 2, 2022 corresponding to PCT International Application No. PCT/EP2021/078087 filed Dec. 10, 2021.

*Primary Examiner* — Tracie Y Green
(74) *Attorney, Agent, or Firm* — Henry M. Feiereisen LLC

(57) ABSTRACT

A semiconductor module includes a first substrate, a second substrate having a closed, in particular continuous, hollow chamber structure, and a semiconductor element having a first side connected to the first substrate in a planar manner and a second side which faces away from the first side and is connected to the second substrate in a planar manner. A phase change material is arranged in the hollow chamber structure of the second substrate and in thermally conductive connection with the semiconductor element.

10 Claims, 3 Drawing Sheets

(51) Int. Cl.
    *H10W 40/00*     (2026.01)
    *H10W 40/73*     (2026.01)
    *H10W 70/685*     (2026.01)
    *H10W 90/00*     (2026.01)

(56)            References Cited

U.S. PATENT DOCUMENTS

| | | |
|---|---|---|
| 2013/0285233 A1* | 10/2013 | Bao ........................ H01L 23/427 |
| | | 257/E23.101 |
| 2013/0328200 A1 | 12/2013 | Bae |
| 2015/0249044 A1 | 9/2015 | Arora et al. |
| 2016/0013117 A1 | 1/2016 | Woehlert et al. |
| 2016/0334844 A1* | 11/2016 | Nguyen ................ H01L 23/552 |
| 2019/0110356 A1* | 4/2019 | Silvano De Sousa ........................ |
| | | H01L 23/3736 |
| 2020/0132392 A1 | 4/2020 | Joshi |
| 2020/0152532 A1 | 5/2020 | Blank et al. |
| 2020/0170111 A1 | 5/2020 | Blank et al. |

FOREIGN PATENT DOCUMENTS

| | | |
|---|---|---|
| WO | WO 2018202439 A1 | 11/2018 |
| WO | WO 2019015901 A1 | 1/2019 |

* cited by examiner

SEMICONDUCTOR MODULE COMPRISING AT LEAST ONE SEMICONDUCTOR ELEMENT

CROSS-REFERENCES TO RELATED APPLICATIONS

This application is the U.S. National Stage of International Application No. PCT/EP2021/078087, filed Oct. 12, 2021, which designated the United States and has been published as International Publication No. WO 2022/122222 A1 and which claims the priority of European Patent Application, Serial No. 20212842.7, filed Dec. 9, 2020, pursuant to 35 U.S.C. 119(a)-(d).

BACKGROUND OF THE INVENTION

The invention relates to a semiconductor module comprising at least one semiconductor element.

The invention furthermore relates to a power converter comprising at least one such semiconductor module.

Moreover, the invention relates to a method for producing a semiconductor module comprising at least one semiconductor element.

Such semiconductor modules are usually used in a power converter. A power converter should, for example, be understood to be a rectifier, an inverter, a frequency converter or a DC/DC converter. Such semiconductor modules are, for example, realized by means of planar electronic packaging technology.

Published unexamined patent application WO 2018/202439 A1 describes an electronic assembly comprising a component that is held between a first substrate and a second substrate. According to the invention, it is provided that a gap between the first substrate and the component is connected to a through-hole such that a solder material can, for example, be dispensed through the through-hole by using capillary forces acting in the through-hole and in the gap. Herein, dispensing is automatic since the capillary forces only act in the gap. Tolerances which can be necessary because of differing gap dimensions can advantageously be compensated by the automatic dispensing of the solder material.

Published unexamined patent application WO 2019/015901 A1 describes an electrical assembly which has at least one electronic switching element which is electrically contacted on its underside and on its upper side which is opposite the underside. The electrical assembly also has two wiring supports which are arranged opposite one another on the electrical contacts. These wiring supports are each at least in part made of a permanently elastic, electrically insulating, thermally conductive material.

With such planar electronic packaging technology, it is difficult to integrate thermal capacities, in particular additional thermal capacities, due to the flat structure. Such thermal capacities are in particular required for high and short-term overload requirements in order, for example, to keep chip temperature fluctuations small. A phase change material is suitable for significantly reducing such temperature fluctuations. A phase change material (PCM) is known to be a material characterized by high melting enthalpy and thus capable of absorbing a considerable amount of thermal energy during the transition from the solid state to the liquid state, known as phase change.

Published unexamined patent application DE 10 2014 213 545 A1 describes a power semiconductor module in which a ceramic wiring support functions as a heat sink by combining a phase change material with the ceramic wiring support. The phase change material is introduced into the cavities of the wiring support which are open to the surface of the wiring support and which are, for example, embodied as bores, in particular as blind holes.

The phase change material can escape through the openings thus resulting in a reduction and eventual loss of the phase change material. Furthermore, the openings cause accelerated ageing of the phase change material. The thermal capacity is significantly reduced by the escape and ageing of the phase change material and this has a negative effect on the reliability of the semiconductor module.

Against this background, it is the object of the present invention to disclose a semiconductor module with greater reliability than the prior art.

SUMMARY OF THE INVENTION

According to the invention, the object is achieved by a semiconductor module comprising at least one semiconductor element, a first substrate and a second substrate, wherein the at least one semiconductor element is connected on a first side to the first substrate in a planar manner and is connected on a second side facing away from the first side to the second substrate in a planar manner, wherein a phase change material is arranged in a closed, in particular continuous, hollow chamber structure of the second substrate and is in thermally conductive connection with the semiconductor element (4).

Furthermore, according to the invention, the object is achieved by a semiconductor module comprising at least one semiconductor element, a first substrate and a second substrate, wherein the at least one semiconductor element is connected on a first side to the first substrate in a planar manner and is connected on a second side facing away from the first side to the second substrate in a planar manner, wherein a phase change material, which is embedded in a matrix, is arranged in the second substrate and is in thermally conductive connection with the semiconductor element.

In addition, according to the invention, the object is achieved by a power converter comprising at least one such semiconductor module.

Moreover, according to the invention, the object is achieved by a method for producing a semiconductor module comprising at least one semiconductor element, a first substrate and a second substrate, wherein a phase change material is arranged in a, in particular continuous, hollow chamber structure of the second substrate, wherein the hollow chamber structure is closed, wherein the at least one semiconductor element is connected on a first side to the first substrate in a planar manner and is connected on a second side facing away from the first side to the second substrate in a planar manner so that the phase change material is in thermally conductive connection with the semiconductor element.

Moreover, according to the invention, the object is achieved by a method for producing a semiconductor module comprising at least one semiconductor element, a first substrate and a second substrate, wherein a phase change material is embedded in a matrix and is arranged in the second substrate, wherein the at least one semiconductor element is connected on a first side to the first substrate in a planar manner and is connected on a second side facing away from the first side to the second substrate in a planar manner so that the phase change material is in thermally conductive connection with the semiconductor element.

The advantages and preferred embodiments listed below with respect to the semiconductor module can be applied mutatis mutandis to the power converter and the production method.

The invention is based on the concept of increasing the reliability of a semiconductor module by means of a heat sink integrated in a substrate, wherein the heat sink comprises a phase change material. The semiconductor module has at least one semiconductor element, a first substrate and a second substrate, wherein the at least one semiconductor element is connected on a first side to the first substrate in a planar manner and is connected on a second side facing away from the first side to the second substrate in a planar manner. Such a semiconductor element is, for example, embodied as a transistor, diode or logic module. In particular, the transistor is embodied as an insulated-gate bipolar transistor (IGBT), metal oxide semiconductor field-effect transistor (MOSFET) or field-effect transistor. For example, such a substrate has at least one dielectric material layer and at least one metallization, also called substrate metallization. In particular, the planar contacting of the at least one semiconductor element takes place via an electrically conductive thermal paste or via a material-bonded connection on the metallization of the respective substrate. The phase change material is arranged in the second substrate. Arrangement of the phase change material in the substrate should be understood as meaning that the phase change material is arranged in a region of the substrate in which at least one dielectric material layer and/or at least one metallization is recessed. Such a recess is, for example, embodied as a cavity. Such integration of the phase change material in the substrate enables placement as close as possible to the semiconductor element, wherein thermally conductive connection of the phase change material with the semiconductor element is established. Such thermal coupling takes place in particular via the metallization of the substrate, which, for example, contains copper and numerous vias.

The phase change material is, for example, characterized by high, in particular volume-specific, melting enthalpy and high cycle stability. Heat loss occurring in the semiconductor element, which is transferred to the phase change material, is at least partially stored in the phase change material by the phase change. In particular, the melting point of the phase change material is below the junction temperature of the at least one semiconductor element. For example, the phase change material contains a metallic solder alloy. A melting point or melting range can be set via the alloy components of the solder alloy.

To prevent the phase change material from escaping, it is arranged in a closed, in particular continuous, hollow chamber structure. Such a closed hollow chamber structure is, for example, a cavity, which, is closed in particular in a fluid-tight manner. The closed, in particular continuous, hollow chamber structure prevents the phase change material from escaping, in particular from outgassing of volatile components, and slows down the ageing thereof, so that the thermal capacity is maintained over an extended period, so that reliability of the semiconductor module is improved.

To prevent the phase change material from escaping, the phase change material is alternatively embedded in a matrix. For example, the matrix used is an adhesive or a polymer, in particular an epoxy material or silicone, with a temperature stability after curing that is above the melting point of the phase change material. Filling the matrix with the phase change material fixes it, thus preventing the phase change material from escaping and slowing down its ageing so that the thermal capacity is retained for a prolonged period of time thus improving the reliability of the semiconductor module.

A further embodiment provides that the phase change material has a melting point in the range of 90° C. to 175° C. For example, the phase change material contains dimethyl terephthalate, D-mannitol, adipic acid, potassium thiocyanate, hydroquinone or benzanilide, The melting point is below the junction temperature of the semiconductor element, which is, for example, just above 175° C. A melting point or melting range can be set via the phase change material, so that thermal energy is efficiently absorbed, in particular in an application-specific manner.

A further embodiment provides that the semiconductor element is connected in a materially bonded manner to an upper metallization of the first substrate and/or to a substrate metallization of the second substrate. Such a material-bonded connection is, for example, embodied as a soldered or sintered connection, which results in improved thermal bonding.

A further embodiment provides that the phase change material is in thermally conductive connection with the semiconductor element via the substrate metallization of the second substrate. In particular, the substrate metallization contains copper and comprises, for example, numerous vias. The thermal coupling via the substrate metallization achieves optimal thermal bonding.

A further embodiment provides that the phase change material is arranged in at least one cavity of the second substrate, which is in thermally conductive connection with the semiconductor element. Such a cavity is easy to realize, for example by milling. Furthermore, a cavity can be flexibly positioned in the layout, so that the phase change material can be placed on-chip, thus providing optimized heat transfer.

A further embodiment provides that the cavity has edge metallization, in particular circumferential edge metallization. The circumferential edge metallization is in particular produced by electroplating and contains, for example copper, thus providing an additional improvement to the thermal bonding.

A further embodiment provides that the cavity has metallic fins which are in thermally conductive connection with the phase change material. For example, the metallic fins are produced by electroplating or by additive means, in particular from copper. For example, the fins are cuboid or cylindrical in shape and increase a surface area within the cavity for thermal contacting of the phase change material.

A further embodiment provides that the closed, in particular continuous, hollow chamber structure of the second substrate comprises a cavity with a closure apparatus. Such a closure apparatus is, for example, produced from a metallic material and closes the cavity, in particular in a fluid-tight manner. Such a fluid-tight closure can, for example, be produced by a material-bonded connection of the closure apparatus with the metallization of the substrate. Alternatively, such a closure apparatus is applied by additive means. Such a closure, in particular fluid-tight closure, is simple and inexpensive to produce.

A further embodiment provides that the closed, in particular continuous, hollow chamber structure comprises at least one additional compensation structure, which is provided to compensate volume changes in the phase change material. Such a compensation structure is, for example, embodied as a recess, in particular an air-filled recess, in which the phase change material can expand in the event of a change in volume. Such a compensation structure is simple and inexpensive to produce.

BRIEF DESCRIPTION OF THE DRAWING

The following describes and explains the invention in more detail with reference to the exemplary embodiments depicted in the figures.

The figures show.

DETAILED DESCRIPTION OF PREFERRED EMBODIMENTS

The exemplary embodiments explained in the following are preferred embodiments of the invention. In the exemplary embodiments, the described components of the embodiments each represent individual features of the invention to be considered independently of one another, which also develop the invention independently of one another and are thus also be to regarded as a component of the invention individually or in a combination other than that shown. Furthermore, the described embodiments can also be supplemented by further of the features of the invention that have already been described.

The reference symbols have the same meaning in the different figures.

Figure 1:
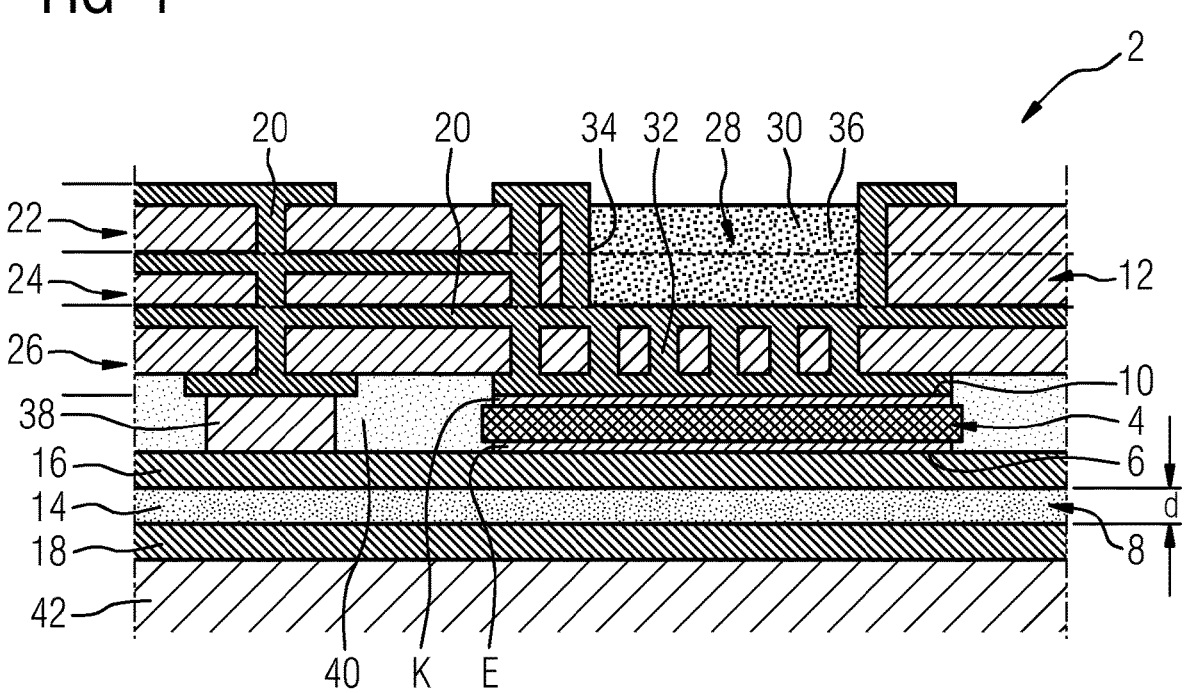
FIG. 1 a schematic representation of a first embodiment of a semiconductor module in cross section, FIG. 2 a schematic representation of a second embodiment of a semiconductor module in cross section, FIG. 3 a schematic representation of a third embodiment of a semiconductor module in cross section, FIG. 4 a schematic representation of a power converter with a semiconductor module and FIG. 5 a schematic representation of a method for producing a semiconductor module.

FIG. 1 shows a schematic representation of a first embodiment of a semiconductor module 2 in cross section. The semiconductor module 2 comprises at least one semiconductor element 4 connected on a first side 6 to a first substrate 8 in a planar manner and connected on a second side 10 facing away from the first side 6 to a second substrate 12 in a planar manner. The planar contacting of the semiconductor element 4 to the first substrate 8 and the second substrate 12 is, for example, produced by a material-bonded connection, in particular a soldered or sintered connection, wherein, in addition to the electrical connection, the material-bonded connection of the semiconductor element 4 with the substrates 8, 12 establishes a thermal coupling in each case.

The semiconductor element 4 is embodied by way of example as an insulated-gate bipolar transistor (IGBT), but can also be embodied as a metal oxide semiconductor field-effect transistor (MOSFET), field-effect transistor, diode, logic module, in particular field programmable gate array (FPGA) or as another type of semiconductor. In particular, the semiconductor element 4 has an area of at least 10 mm². For example, the semiconductor element 4 embodied as an IGBT is connected via an emitter contact E to the first substrate 8 and via a collector contact K to the second substrate 12. A gate contact of the IGBT depicted in FIG. 1 is not shown for reasons of clarity.

The first substrate 8 comprises a dielectric material layer 14 containing a ceramic material, for example aluminum nitride or aluminum oxide, or an organic material, for example a polyamide, and has a thickness d of 25 μm to 650

μm, in particular 50 μm to 250 μm. Moreover, the first substrate 8 has upper metallization 16 on a side facing the semiconductor element 4 and lower metallization 18 on a side facing away from the semiconductor element 4, wherein the upper metallization 16 and the lower metallization 18 are, for example, produced from copper. In particular, the first substrate 8 is embodied as direct bonded copper (DBC).

The second substrate 12 is embodied as a multilayer, for example three-layer, printed circuit board (PCB), wherein the layers 22, 24, 26 of the printed circuit board have structured substrate metallization 20, wherein the semiconductor element 4 is connected in a materially bonded manner to the substrate metallization 20 of the second substrate 12. Furthermore, the second substrate 12 has a, in particular open, cavity 28, in which a phase change material 30 is arranged and is in thermally conductive connection with the semiconductor element 4. For example, the cavity 28 is milled into the first layer 22 and into the second layer 24, wherein the third layer 26 establishes very good thermal bonding of the semiconductor element 4 to the phase change material 30 by means of bilateral substrate metallization 20 and numerous vias 32. The thermal bonding of the phase change material 30 is optimized by edge metallization 34 of the cavity 28.

The phase change material 30 is characterized by high, in particular volume-specific, melting enthalpy and is thus capable of absorbing a considerable amount of thermal energy during the transition from a solid state to a liquid state, known as phase change. In particular, the phase change material 30 has high cycle stability. Heat loss occurring in the semiconductor element 4, which is transferred to the phase change material 30, is at least partially stored in the phase change material 30 due to the phase change. The phase change material 30 has a melting point below the junction temperature of the semiconductor element 4. In particular, the phase change material 30 has a melting point in the range of 90° C. to 175° C. For example, the phase change material 30 contains dimethyl terephthalate, D-mannitol, adipic acid, potassium thiocyanate, hydroquinone or benzanilide. Alternatively, the phase change material contains a metallic solder alloy. A melting point or melting range can be set via the alloy components of the solder alloy. The metal surfaces wetted by the solder alloy can have a protective coating that prevents alloying of the wetting metal surfaces. For fixation in the, in particular open, cavity 28, the phase change material 30 is embedded in a matrix 36. For example, the matrix 36 used is an adhesive or a polymer, in particular an epoxy material or silicone with a temperature stability after curing that is above the melting point of the phase change material 30. The matrix 36 is, for example, filled with particles of the phase change material 30.

Furthermore, a metallic spacer element 38, which connects the emitter contact E of the semiconductor element 4 to the second substrate 12 in an electrically conductive manner is arranged between the first substrate 8 and the second substrate 12. The metallic spacer element 38, which is also called a transfer element, is, for example, produced from copper, aluminum or one of their alloys. Moreover, the semiconductor element 4 is arranged in a potting chamber 40 between the first substrate 8 and the second substrate 12, which is filled, in particular completely, by a potting compound. In addition, the first substrate 8 is connected to a metallic base plate 42 in particular in a materially bonded manner, which is, for example, embodied as a heat sink.

Figure 2:
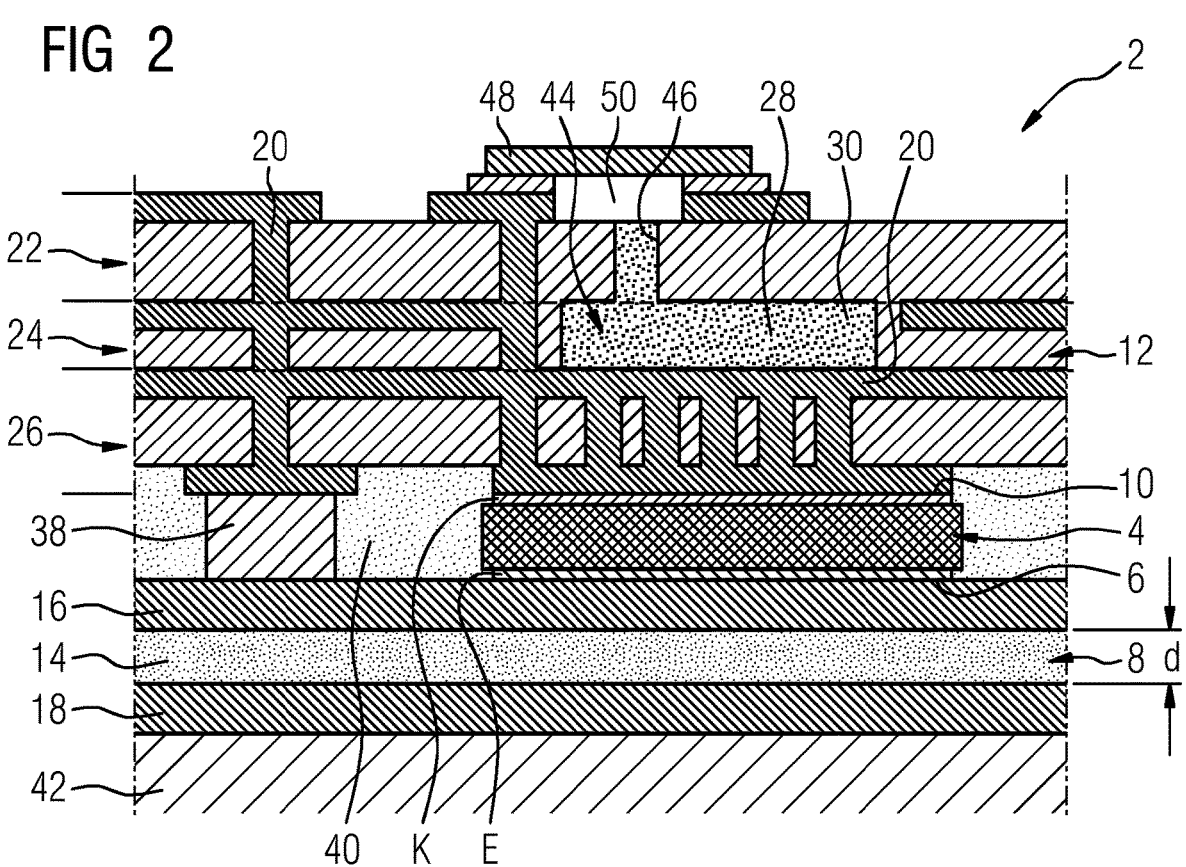

FIG. 2 shows a schematic representation of a first embodiment of a semiconductor module 2 in cross section. The phase change material 30 is arranged in a closed continuous hollow chamber structure 44 of the second substrate 12. The closed hollow chamber structure 44 means the phase change material 30 does not have to be embedded in a matrix 36. The continuous hollow chamber structure 44 comprises a cavity 28, which is arranged in the second layer 24 of the second substrate 12 and closed on both sides by the first layer 22 and the third layer 26. The continuous hollow chamber structure 44, which forms an enclosed reservoir for the phase change material 30, comprises a filling orifice 46 for the phase change material 30, which extends through the first layer 22 of the second substrate 12. The filling orifice 46 is closed by a closure apparatus 48, in particular in a fluid-tight manner. For example, the, in particular metallic, closure apparatus 48 is connected to the substrate metallization 20 in a materially bonded manner, wherein a compensation structure 50, which is provided to compensate volume changes in the phase change material 30, is formed. The further embodiment of the semiconductor module 2 in FIG. 2 corresponds to that in FIG. 1.

Figure 3:
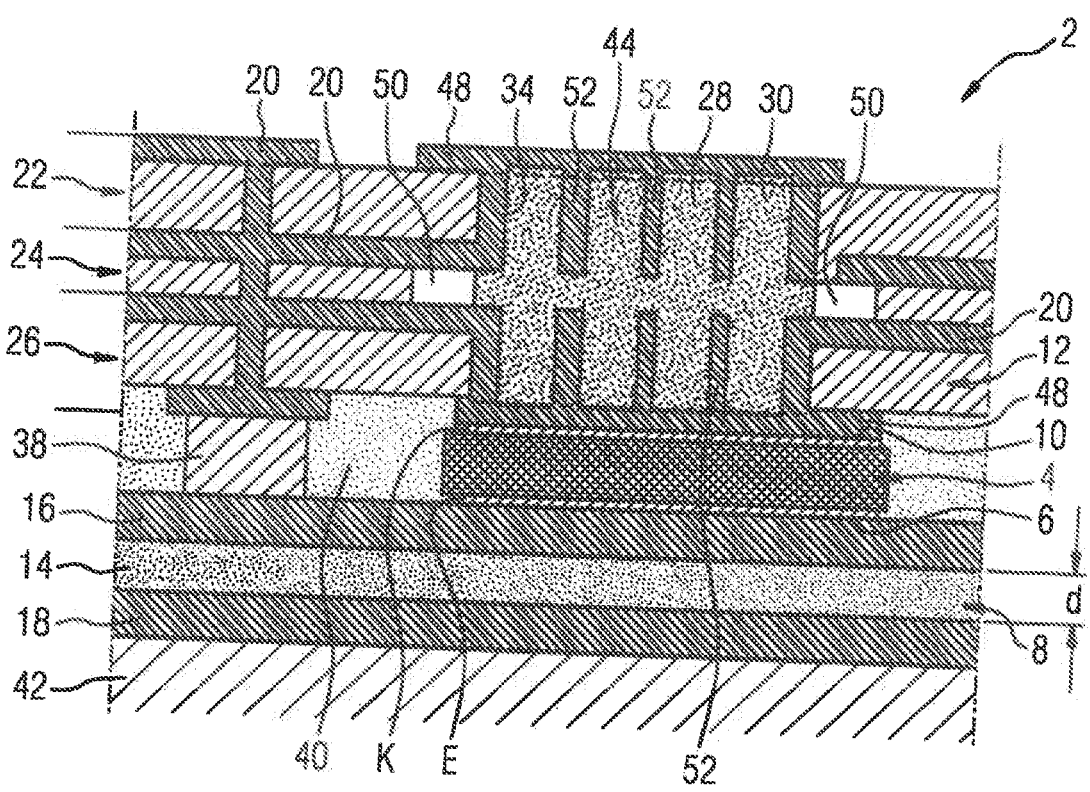

FIG. 3 shows a schematic representation of a third embodiment of a semiconductor module 2 in cross section. The closed hollow chamber structure 44 comprises a cavity 28, which extends across all layers 22, 24, 26 of the second substrate 12. Furthermore, the cavity 28 has metallic fins 52, which are in thermally conductive connection with the phase change material 30. The fins 52 increase the contact surface resulting in improved thermal contacting of the phase change material 30. The hollow chamber structure 44 is embodied as continuous and is closed by metallic closure apparatuses 48 arranged on both sides, which are, for example, produced by metallizing the solidified phase change material 30. The phase change material 30 is connected, in particular directly, to the semiconductor element 4 via a metallic closure apparatus 48. In particular, the metallic closure apparatuses 48 arranged on both sides are part of the substrate metallization 20 of the second substrate 12. Furthermore, the closed continuous hollow chamber structure 44 has compensation structures 50, which are arranged in the region of the second layer 24 and are provided to compensate volume changes in the phase change material 30. The further embodiment of the semiconductor module 2 in FIG. 3 corresponds to that in FIG. 2.

Figure 4:
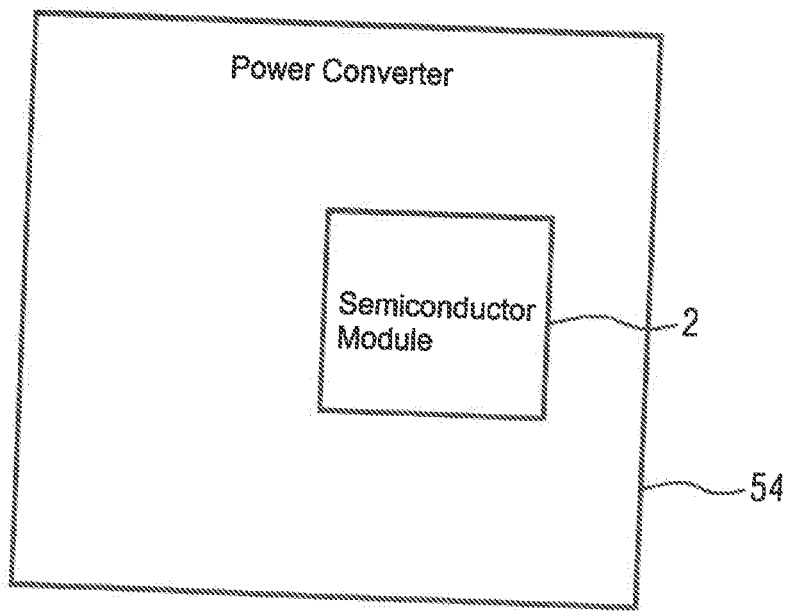

FIG. 4 shows a schematic representation of a power converter 54 with a semiconductor module 2. The power converter 54 can comprise more than one semiconductor module 2.

Figure 5:
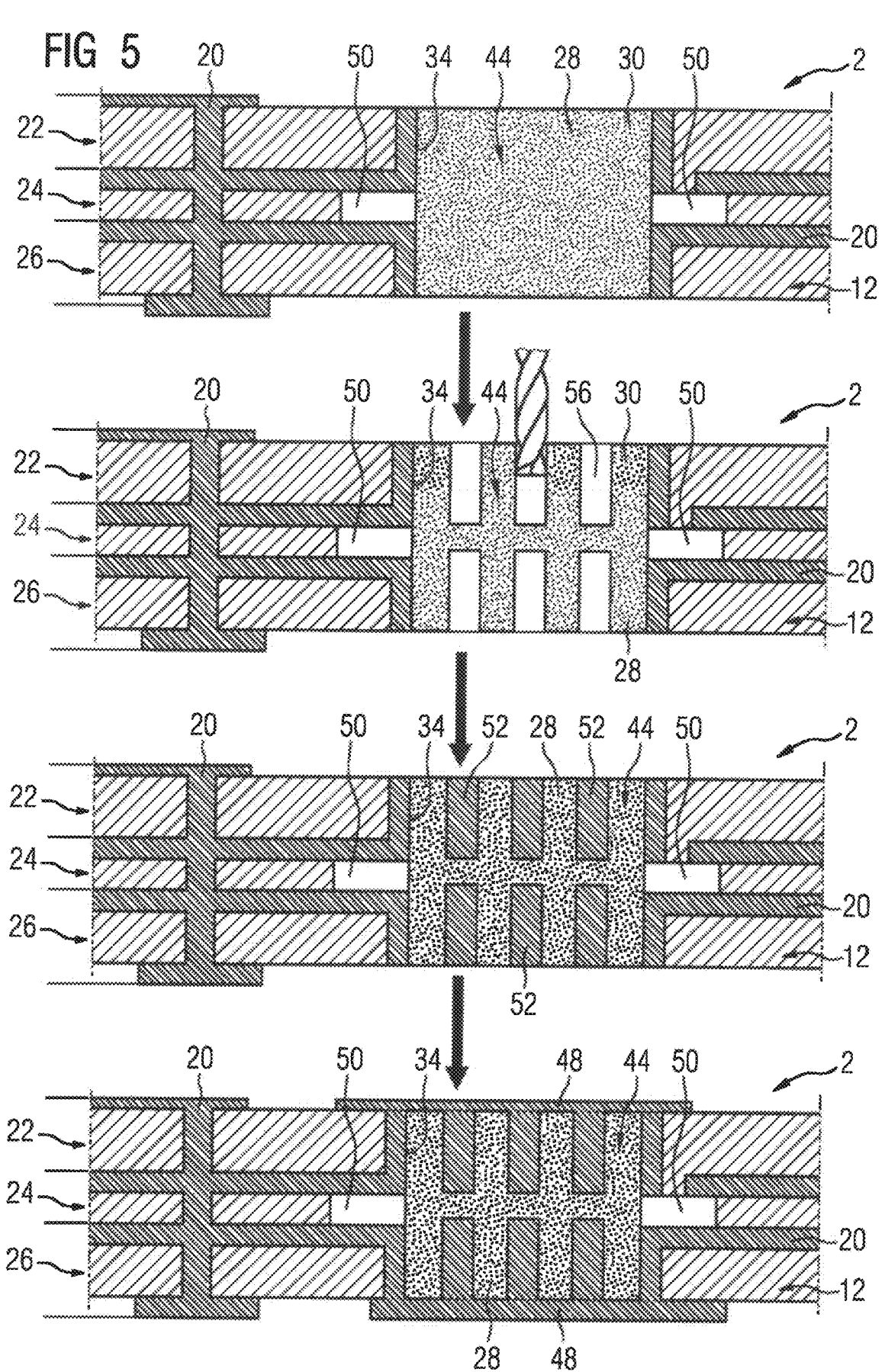

FIG. 5 shows a schematic representation of a method for producing a semiconductor module 2. The second substrate 12 has a cavity 28, which extends across all layers 22, 24, 26 of the second substrate 12 and forms a hollow chamber structure 44. The phase change material 30 is introduced into the hollow chamber structure 44 where it is solidified, wherein compensation structures 50 are formed in the region of the second layer 24. Recesses are then introduced into the solidified phase change material 30, for example by drilling or milling, and, in a subsequent step, metallic fins 52 are introduced into said recesses. Alternatively, the fins 52 are produced by metallization, for example, electroplating or additive means. Then, the hollow chamber structure 44 filled with the phase change material 30 is closed by closure apparatuses 48, which are produced by metallization. In particular, the solidified phase change material 30 is metallized on both sides. Herein, the fins 52 are electrically and thermally conductively connected to the substrate metallization 20 of the second substrate 12 by metallization. Then, as shown in FIG. 3, the semiconductor element 4 is connected on a first side 6 to the first substrate in a planar manner 8 and is connected on a second side 10 facing away from the first side 6 to the second substrate in a planar manner 12, so that the phase change material 30 is in thermally conductive connection with the semiconductor element 4. The further embodiment of the semiconductor module 2 in FIG. 5 corresponds to that in FIG. 3.

In summary, the invention relates to a semiconductor module 2 comprising at least one semiconductor element 4, a first substrate 6 and a second substrate 12. In order to achieve higher reliability compared to the prior art, it is proposed that the at least one semiconductor element 4 is connected on a first side 6 to the first substrate in a planar manner 8 and is connected on a second side 10 facing away from the first side 6 to the second substrate in a planar manner 12, wherein a phase change material 30 is arranged in a closed, in particular continuous, hollow chamber structure 44 of the second substrate 12 and is in thermally conductive connection with the semiconductor element 4.

The invention claimed is:

1. A semiconductor module, comprising:
a first substrate:
a second substrate composed of a first layer a second layer and a third layer which form a closed hollow chamber structure, the second layer interposed between the first layer and the third layer;
a semiconductor element having a first side connected to the first substrate in a planar manner and a second side which faces away from the first side and is connected to the third layer of the second substrate in a planar manner;
a phase change material arranged in the closed hollow chamber structure of the second substrate and in thermally conductive connection with the semiconductor element, and
a first set of metallic fins in thermally conductive connection with the first layer and a first second set of metallic fins in thermally conductive connection with the second layer, with the first set and the second set of the metallic fins in thermally conductive connection with the phase change material without direct material contact between the metallic fins of the first set and the second set.

2. The semiconductor module of claim 1, wherein the cavity hollow chamber structure has a circumferential edge metallization.

3. The semiconductor module of claim 1, wherein the closed hollow chamber structure of the second substrate comprises a cavity with a closure apparatus.

4. The semiconductor module of claim 1, wherein the phase change material has a melting point in a range of 90° C. to 175° C.

5. The semiconductor module of claim 1, wherein the semiconductor element is connected in a materially bonded manner to an upper metallization of the first substrate and/or to a substrate metallization of the second substrate.

6. The semiconductor module of claim 5, wherein the phase change material is in thermally conductive connection with the semiconductor element via the substrate metallization of the second substrate.

7. A power converter, comprising a semiconductor module as set forth in claim 1.

8. A semiconductor module, comprising:
a first substrate;
a second substrate having a closed continuous hollow chamber structure;
a semiconductor element having a first side connected to the first substrate in a planar manner and a second side which faces away from the first side and is connected to the second substrate in a planar manner; and a phase change material arranged in the closed continuous hollow chamber structure of the second substrate and in thermally conductive connection with the semiconductor element, wherein the closed continuous hollow chamber structure comprises a compensation structure configured to store excess phase change material and to compensate a volume change in the phase change material.

9. A power converter, comprising a semiconductor module as set forth in claim 8.

10. A method, comprising:

connecting a first side of a semiconductor element to a first substrate in a planar manner;

connecting a second side of the semiconductor element, which second side faces away from the first side, to a second substrate in a planar manner;

arranging a phase change material in a closed continuous hollow chamber structure of the second substrate, so that the phase change material is in thermally conductive connection with the semiconductor element;

solidifying the phase change material in the hollow chamber structure;

metallizing the solidified phase change material on both sides to close the hollow chamber structure;

inserting fins into the solidified phase change material; and connecting the fins to a substrate metallization of the second substrate by metallization.

* * * * *